(12) United States Patent
Poletto et al.

(10) Patent No.: US 9,929,556 B2
(45) Date of Patent: Mar. 27, 2018

(54) FAIL-SAFE DEVICE CORRESPONDING APPARATUS AND VEHICLE

(71) Applicant: STMICROELECTRONICS S.r.l., Agrate Brianza (IT)

(72) Inventors: Vanni Poletto, Casale Monferrato (IT); Manuel Gaertner, Feldkirchen (DE); Sergio Lecce, Pavia (IT); Giovanni Luca Torrisi, Aci Catena (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 308 days.

(21) Appl. No.: 14/753,103

(22) Filed: Jun. 29, 2015

(65) Prior Publication Data

US 2016/0094022 A1    Mar. 31, 2016

(30) Foreign Application Priority Data

Sep. 30, 2014   (IT) .............................. TO2014A0775

(51) Int. Cl.
| | |
|---|---|
| H02H 3/05 | (2006.01) |
| H02H 7/085 | (2006.01) |
| H02H 7/09 | (2006.01) |
| H03K 19/007 | (2006.01) |
| H02H 7/08 | (2006.01) |

(52) U.S. Cl.
CPC ............ *H02H 3/05* (2013.01); *H02H 7/0851* (2013.01); *H02H 7/09* (2013.01); *H03K 19/007* (2013.01); *H02H 7/0844* (2013.01); *H02H 7/0852* (2013.01)

(58) Field of Classification Search
None
See application file for complete search history.

(56) References Cited

U.S. PATENT DOCUMENTS

| | | | | |
|---|---|---|---|---|
| 4,314,301 | A * | 2/1982 | Kondow | H02H 3/05 361/62 |
| 4,320,508 | A * | 3/1982 | Takezoe | H04B 1/745 370/222 |
| 4,937,811 | A * | 6/1990 | Harris | H04L 12/423 370/200 |
| 5,747,884 | A | 5/1998 | Voehringer et al. | |
| 6,208,536 | B1 | 3/2001 | Boesche et al. | |
| 6,259,587 | B1 | 7/2001 | Sheldon et al. | |
| 6,937,450 | B1 * | 8/2005 | Mayer | B23Q 5/58 361/42 |
| 7,994,795 | B2 * | 8/2011 | Drake | G01R 19/16566 307/9.1 |
| 8,412,409 | B2 * | 4/2013 | Fey | G05B 9/03 257/500 |
| 8,493,703 | B2 * | 7/2013 | Kirschbaum | G06F 1/206 361/103 |

(Continued)

*Primary Examiner* — Thomas J Hiltunen
(74) *Attorney, Agent, or Firm* — Slater Matsil, LLP

(57) ABSTRACT

A fail-safe device may be coupled to a main device for actuating a switch responsive to a failure. The fail-safe device may include a fail-safe circuit, and an isolation trench surrounding the fail-safe circuit and isolating the fail-safe circuit from the main device. The fail-safe device may include an internal power supply connection, an internal reference voltage connection, a self-biased drive block configured to drive the at least one switch, and a receiver configured to receive failure signals from the main device.

22 Claims, 6 Drawing Sheets

(56) References Cited

U.S. PATENT DOCUMENTS

| | | | | |
|---|---|---|---|---|
| 8,660,489 B2 * | 2/2014 | Barrenscheen | ........ | G08C 17/06 |
| | | | | 375/258 |
| 8,841,940 B2 * | 9/2014 | Barrenscheen | ..... | H02M 3/3376 |
| | | | | 327/108 |
| 9,130,559 B1 * | 9/2015 | Ahmad | ................ | H03K 19/003 |
| 9,638,744 B2 * | 5/2017 | Bernon-Enjalbert | | G06F 17/5045 |
| 2008/0258253 A1 * | 10/2008 | Fey | .................... | G05B 19/0428 |
| | | | | 257/500 |
| 2016/0065398 A1 * | 3/2016 | Candage | .................. | H03F 1/26 |
| | | | | 375/244 |

\* cited by examiner

FAIL-SAFE DEVICE CORRESPONDING APPARATUS AND VEHICLE

RELATED APPLICATION

This application is based upon prior filed copending Italian Application No. TO2014A000775 filed Sep. 30, 2014, the entire subject matter of which is incorporated herein by reference in its entirety.

TECHNICAL FIELD

The present disclosure relates to fail-safe devices, and particularly to, fail-safe devices in vehicles.

BACKGROUND

The fail-safe function is a widely adopted function in the vehicle sector that may, for example, be used for detecting and warning of anomalous behavior of a function of a vehicle. This warning is to prevent, in the presence of a failure, situations that are dangerous for the occupants of a vehicle from arising. In various possible implementations, a device capable of providing such a function, in the case where it detects a fault, can enter a fail-safe mode in which, for example, an external safety logic and/or an additional microcontroller assume/assumes control of the safety circuits for ensuring that the system enters/evolves in a safe state, that is not dangerous for the occupants.

The specific characteristics of safety involved may depend upon the application. For instance, in the case of applications to the door zone, the motorized window function may be considered important for safety in so far as, for example, an erroneous or undesired operation may prove quite harmful for the occupants.

Various implementations may envision a fail-safe logic comprising a power-management device and various external components. To provide a fail-safe function (e.g. to keep a window-regulator deactivated), one or more implementations may require external components, which are to be activated only if a failure in the power-management function is detected. In the presence of lack of operation, for example, of the logic contained in the device for operating the window-regulator (generically referred to as "door zone"), with such implementations, there may not be entry into action of the fail-safe circuit.

There may arise situations in which the fail-safe function is activated only in the presence of detectable failures within the power-management function such as, for example: a failure of the so-called watchdog function (Watchdog Failure); a failure of the power supply (V1 under-voltage); and triggering of a thermal-safety function (for example, second thermal shutdown level—TSD2). It will likewise be noted that there cannot be an activation of the fail-safe function in the presence of a failure in the door actuation device, for example, owing to malfunctioning of the logic circuitry or to triggering of a thermal safety device. Various implementations may be based upon using two distinct chips, but it may instead be desirable to have available single chip solutions.

SUMMARY

Generally speaking, a fail-safe device may be coupled to a main device for actuating at least one switch responsive to a failure. The fail-safe device may comprise a fail-safe circuit, and an isolation trench surrounding the fail-safe circuit and isolating the fail-safe circuit from the main device. The fail-safe device may include an internal power supply connection, an internal reference voltage connection, at least one self-biased drive block configured to drive the at least one switch, and a receiver configured to receive failure signals from the main device.

DETAILED DESCRIPTION

In the ensuing description, various specific details are illustrated aimed at providing an in-depth understanding of various examples of embodiments. The embodiments may be obtained without one or more of the specific details, or with other methods, components, materials, etc. In other cases, known structures, materials, or operations are not illustrated or described in detail so that the various aspects of the embodiments will not be obscured.

Reference to "an embodiment" or "one embodiment" in the framework of the present disclosure is intended to indicate that a particular configuration, structure, or characteristic described in relation to the embodiment is comprised in at least one embodiment. Hence, phrases such as "in an embodiment" or "in one embodiment" that may be present in different points of this description do not necessarily refer to the embodiment itself. Furthermore, particular conformations, structures, or characteristics may be combined in any adequate way in one or more embodiments. The references used herein are provided merely for convenience and hence do not define the sphere of protection or the scope of the embodiments.

The object of one or more embodiments is to provide improvements capable of overcoming the drawbacks and limitations outlined above. According to one or more embodiments, this object is achieved thanks to a device having the characteristics referred to in the ensuing claims. One or more embodiments may refer also to a corresponding apparatus, as well as a corresponding vehicle. The claims form an integral part of the technical teaching provided herein in relation to the embodiments.

One or more embodiments may present one or more of the following advantages: possibility of doing without external components; capacity of detecting failures both in power management and, for example, in a door actuator, for instance for reasons linked to the logic or to the temperature; possibility of implementation at the level of monolithic chip; contained current absorption; physical isolation of the fail-safe block, for example, via a ring-trench structure; and compactness. As has been seen, one or more embodiments may find application, for example, in the vehicle sector.

Figure 1:
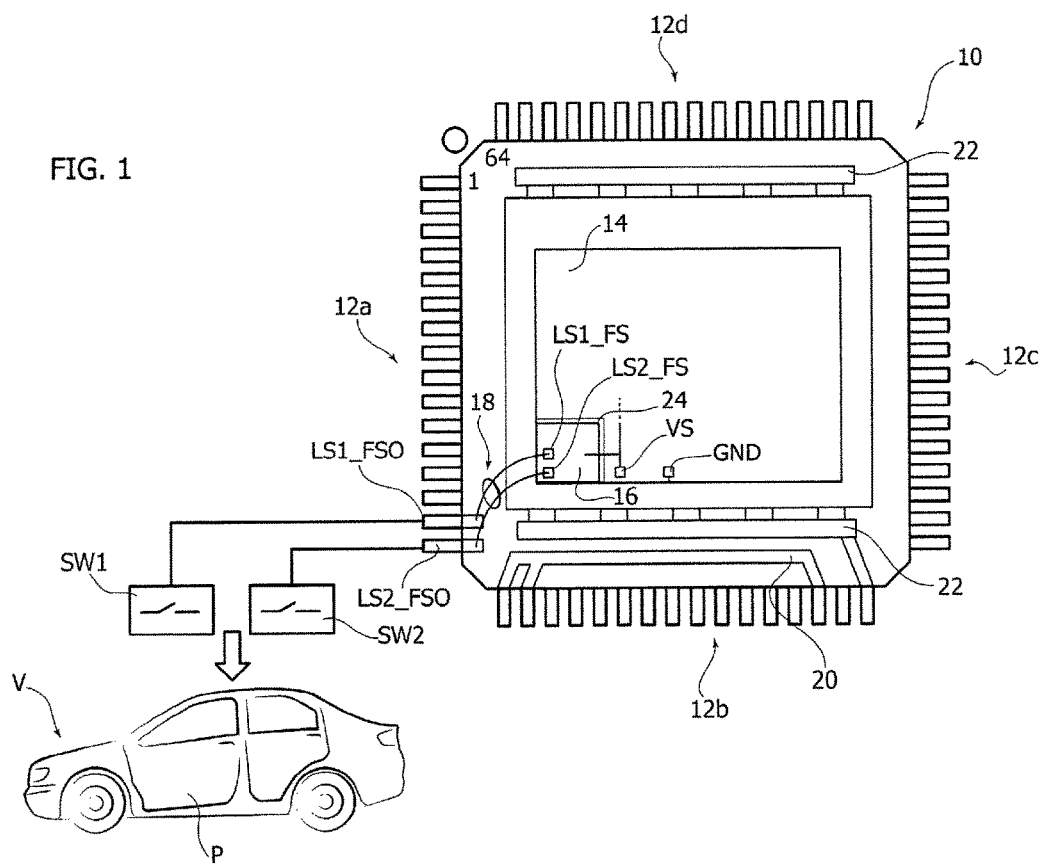
FIG. 1 is a schematic block diagram of an apparatus including a fail-safe device, according to the present disclosure.

In FIG. 1, the reference 10 designates as a whole a module, which may perform a range—even rather wide—of functions of command and control. With reference to the (non-limiting) example already cited previously, it may be a module 10 that can perform the "door module" function capable of ensuring, for example, the functions of command and control linked to one or more doors P of a vehicle V such as, for example, a car. Modules that are able to provide this function are known for use in the vehicle sector.

In FIG. 1, the references 12a to 12d designate the pins that enable connection of the module to the set of the components (not shown in the figures) with which the module 10 is to co-operate in order to perform its functions. They may, by way of example, be 64 pins arranged in four sets of 16 pins, each being set on one of the sides of a square module. These indications are purely illustrative and are not to be considered in a limiting sense. Once again, by way of illustrative reference, these functions may be either power-management functions or door-actuator functions or both.

Among the functions of the first group, there may be cited, for example, the functions known as LDO (Low-Dropout) voltage regulator, LIN (Local Interconnect Network), CAN (Control Area Network), wake-up inputs, outputs of the operational amplifiers, fail-safe output (with the characteristics described more fully in what follows), and SPI (Serial Peripheral Interface). Among the functions of the second group there may be cited, for example, the function for controlling the driving (half)bridges of the motor or motors, the functions for driving (e.g., High Side Driver or HSD) the lights/LEDs, control of the rearview mirror, various door-operating functions, for example, for external MOSFETs (metal oxide semiconductor field effect transistor) (also in this case the characteristics will be described more fully in what follows), and SPI. Implementation of the functions outlined above may to a large extent be based upon known approaches, such as not to require a detailed description herein, but on the other hand bearing in mind the further indications provided in the framework of the present disclosure.

In one or more embodiments, the module 10 may comprise: a main circuit 14; and a fail-safe circuit 16. The two devices 14 and 16 may be coupled together, optionally integrating them in a single chip (the so-called single chip). In one or more embodiments, the device 16 may be entrusted principally with the function of driving (e.g., via signals LS1_FS and LS2_FS generated on corresponding terminals or pads of the chip that come under two output pins LS1_FSO and LS2_FSO) two switches SW1 and SW2 that supervise performance of functions considered critical for the purposes of the particular application.

For example (and without this implying any limitation), the pins LS1_FSO and LS2_FSO can control two switches SW1, SW2, which may be obtained, for example, as electronic switches such as MOSFETs, for example, with the capacity of turning off the switches SW1, SW2. Once again purely by way of illustrative reference, the signals LS1_FS and LS2_FS may be assumed as being transmitted via connection wires 18 to the pins LS1_FSO and LS2_FSO and from these to the gates of the aforesaid MOSFETs.

The switches SW1 and SW2 may correspond, for example, to the external MOSFETs on the high side of the H-bridge for driving a window-regulator of the vehicle V, affording the possibility of "opening" the switches, thus preventing operation of the window-regulator, for example, in the presence of a failure considered "fatal." Of course, the indications presented herein are provided purely by way of non-limiting example in so far as, for example, in one or more embodiments: the number of signals LS1_FS and LS2_FS and of the corresponding pins LS1_FSO and LS2_FSO involved in the fail-safe function may be any, either just one or more than one; the effect of the fail-safe state may correspond to grounding (e.g. by way of low-side drivers) of the signals LSx_FS or, more in general, to any function of opening or turning-off of a switch, of closing or activation of a switch, or to a different function; and the function for which fail-safe mechanism is triggered may be any.

In the diagram of FIG. 1, the references VS and GND denote the supply voltage and the ground terminal of the module 10 (primarily of the main device 14) that come under a power bar 20 and a ground ring 22. One or more embodiments may aim at enabling the device 16 to remain in operating conditions even in the case where driving of the switches (MOSFETs) and the corresponding control blocks in the module 10 (main device 14) undergo a destructive failure.

Figure 2:
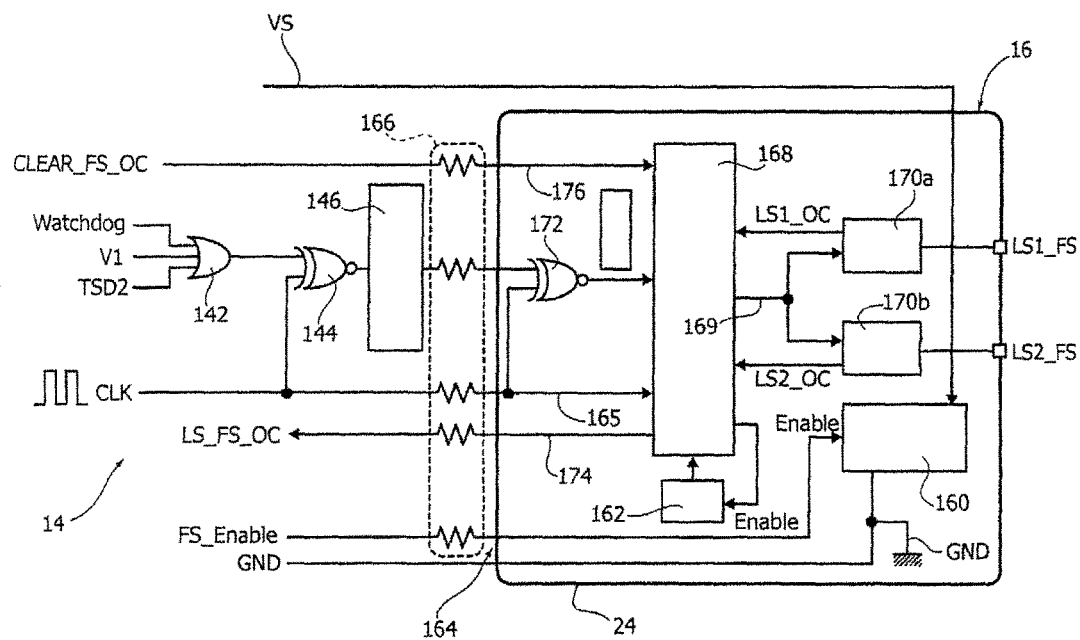
FIG. 2 is a circuit diagram of the fail-safe device, according to the present disclosure.

As illustrated, for example, in FIG. 2, in one or more embodiments the module 16 may present a power supply and a ground connection of its own independent of the other power supplies and of the ground connection of the main device 14. For this purpose, in one or more embodiments, the fail-safe device 16 may comprise an autonomous voltage regulator 160 and a clock oscillator 162 of its own that can be enabled, for example, by respective enable signals Enable. The enables signals may be received, for example: for the regulator 160, on an input terminal 164 through a protection network 166 described more fully in what follows; and for the clock 162, by a circuit 168 (e.g., a filtering circuit and/or a circuit such as to constitute a finite-state machine).

In one or more embodiments, the circuit 168 may supervise operation of the device 10, for example, by governing driving circuits 170a and 170b that are designed to issue the signals of the outputs LS1_FS and LS2_FS of the fail-safe device 16: in this regard, it is to be recalled once again that the number of these outputs, exemplified here as being two, may in fact be any. In one or more embodiments, the fail-safe device 16 may be surrounded by a ground isolation ring (GND isolation ring) 24, which may be formed, for example, via deep-trench isolation (DTI).

Figure 3:
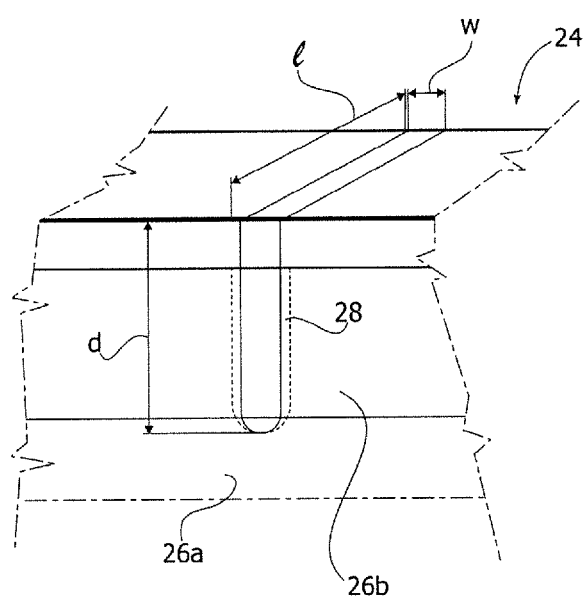
FIG. 3 is a view of an isolation of the deep trench-isolation (DTI) type, according to the present disclosure.

In one or more embodiments, the DTI ring 24 may be obtained as exemplified in FIG. 3, where the references 26a and 26b designate portions of a silicon substrate, having p+ and p− doping respectively, with the trench 28 that extends from the surface as far as the bottom layer 26a with p+ doping. By way of reference (and once again without this implying any limitation), the trench 28 may present a depth d of about 25 μm and a width w of about 2.4 μm.

The filling of the trench may be an oxide-based material on the vertical surfaces of the trench, so as to guarantee isolation between the two areas at the sides of the trench, plus polysilicon with p+ doping so as to be able to provide a low-resistive substrate connection between the substrate (ground of the device) and the overlying circuitry, for example, with a linear value R·l of 1 Ω/mm, namely, with reference to the surface area (A=w·l) with values R·A in the region of 3 mΩ/mm2. In one or more embodiments, such an isolation of a deep-trench type can reduce the impedance of the connection towards the substrate starting from the surface of the chip ("die") by at least three orders of magnitude.

Figure 4:
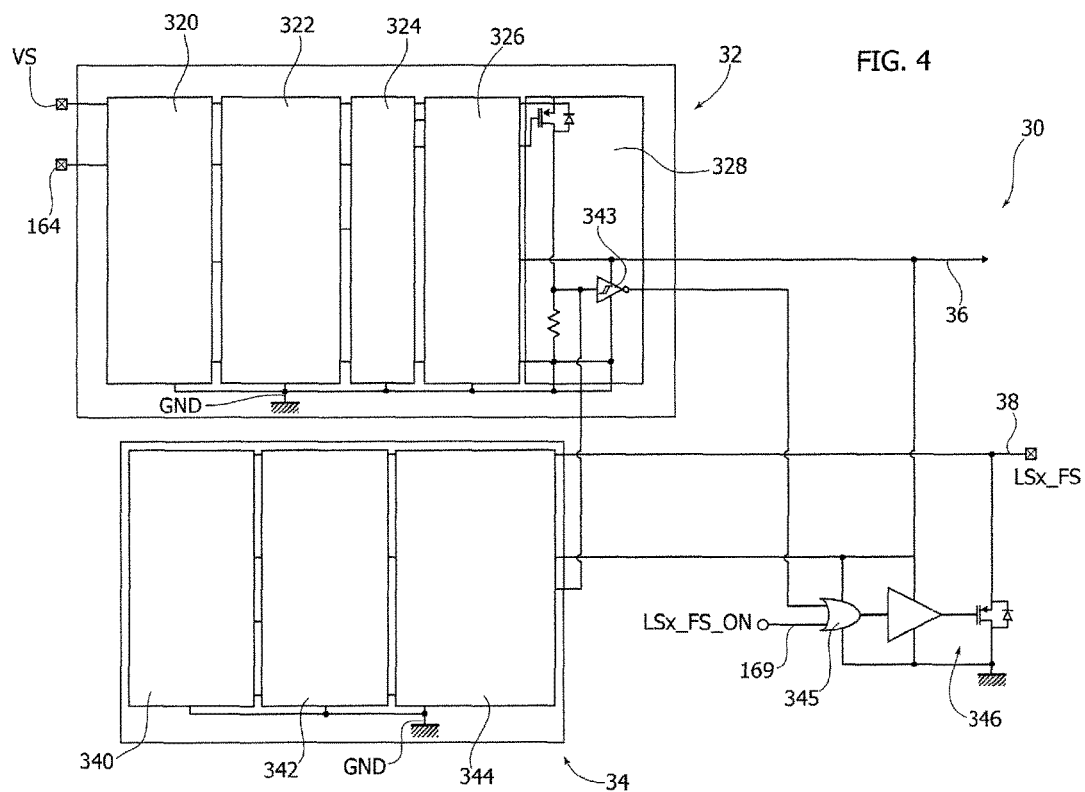
FIG. 4 is a schematic block diagram of the self-bias block, according to the present disclosure.

In one or more embodiments, the device 10 is able to perform a driving function (LS driver) for very low voltage values, hence with the possibility of activating the fail-safe function also in conditions of low power-supply (battery) voltage, and possibly also in conditions of complete disconnection of the power supply. In one or more embodiments, such a result (with the possibility of ensuring, for example, switching-off of the external MOSFETs SW1, SW2 also in these conditions) may be achieved with a self-bias scheme implemented according to the criteria represented more clearly in FIG. 4.

The diagram illustrated herein exemplifies possible embodiments of a self-bias circuit 30, which may be implemented, for example, in association with the voltage-regulator block 160 of the general diagram of FIG. 2. In one or more embodiments, the self-bias circuit 30 may comprise blocks or stages 32, 34, where the block 32 may be viewed as corresponding to the voltage regulator 160 of the general diagram of FIG. 2 (which can thus be prearranged for self-biasing). Whereas, the block 34 represents the self-bias function proper of the drivers 170a and 170b: in FIG. 4, the components external to the blocks 32 and 34 represent the generic driver 170a,170b in a simplified way.

In one or more embodiments, the self-bias circuit 30 can ensure, on the one hand, on a line 36, supply of the fail-safe device 16 as a whole and, on the other hand, on another line or on a complex of other lines 38 (according to the applications and the number of output signals envisaged) the driving signals LS1_FS, LS2_FS, here designated as a whole by LSx_FS.

In one or more embodiments, the stage 32, which receives at an input the supply voltage VS of the module 10 and the enable signal received on the input terminal 164 (see FIG. 2), may comprise the following cascaded blocks: a start-up block 320; a bandgap voltage reference 322; a current-generator block Vbg/R 324; a voltage-generator block proper (operating, for example, at a voltage of 3.3 V) 326; and a self-bias-control module 328. In one or more embodiments, the self-bias circuit proper may comprise the following blocks: a start-up block 340; a current-generator block ΔVgs/r 342; and a supply-voltage generator block 344, for example, generating a voltage of 3.3 V. In one or more embodiments, the outputs of the two blocks 32 and 34 can converge on one and the same supply line 36.

In one or more embodiments, the blocks 32 and 34 may likewise have available a further output, for example, a Schmitt trigger 343, which in turn comes under a logic gate (e.g. an OR gate) 345, on the other input of which, on the line 169 (FIG. 2), a signal LSx_FS_ON is present coming from the block 168 so as to be able to ensure, via a driving stage 346, supply of the signal LSx_FS on the line 38. In this way, it is possible to ensure that the effect of the input in the fail-safe state may, for example, be grounding (via the low-side driver) of the lines LSx_FS, in such a way that, for example in the case where the power supply fails or the fail-safe block is disabled, these same lines are grounded (e.g. with the result that the window-regulator cannot be driven).

In one or more embodiments as exemplified herein, the self-bias circuit enables use of the output line LSx_FS for supplying the driver itself: if there is voltage at output, this is used, for example, for switching on the low-side driver and grounding the output itself. In one or more embodiments as exemplified herein, this loop sustains itself and is capable of lowering the output voltage down to less than 2V, which is a voltage sufficiently low that it is possible to consider, for example, the MOSFET of the external H-bridge as being off.

In one or more embodiments, the possibility of the device 16 having available an autonomous power supply of its own, even in conditions of failure, enables it to keep one of its own oscillators (for example, the clock 162) and a corresponding receiver circuit (for example, comprised in the module 168) active so that it can receive, starting from the main device 14, signals identifying the condition of failure.

In one or more embodiments, this function can be implemented in such a way that it is possible to distinguish different types of failure. This may enable, for example, implementation of differentiated safety interventions according to the type of failure considered.

By way of example, FIG. 2 shows that the main device 14 be provided (according to criteria in themselves known, which do not require any description herein) for detection of at least three different types of failure signals: absence of the watchdog signal (Watchdog Failure); lowering or drop of the supply voltage signal (V1 under-voltage); and disconnection following upon overheating (second thermal-shutdown level—TSD2). Of course, the signals that can be monitored may be different both as regards the number and as regards their nature (for example, SPI fail, Tj, etc.).

In one or more embodiments, the above signals may be combined together, at the level of a main device 14, for example, via a logic gate 142 of an OR type, and may undergo an encoding, such as, for example—in one or more embodiments—a Manchester encoding. The above encoding may be performed, for example, via an EX-NOR gate 144 according to the encoder. This gate can receive, in addition to the signal at output from the gate 142, also a clock signal that drives a transmitter 146, which may transmit (through a protection circuit 166 described in what follows) the encoded signals towards a decoder of a complementary type (for example, a Manchester-code decoder) 172, which is located in the fail-safe device 16 and operation of which may be timed by the clock signal of the main circuit 14, which reaches the fail-safe device 16 through the protection 166 on an input 165.

In one or more embodiments, an encoding, such as a Manchester encoding, can ensure operation of the device 16 when the clock signal of the main device 14 is missing or stuck. Added to this is also the possibility of detection of other failure modes, such as the absence of data from the main device 14 (e.g. owing to possible failure of the connection therewith). In one or more embodiments, transmission of the signals between the main device 14 and the fail-safe device 16 may comprise also other signals, such as, for example, a signal LS_FS_OC issued by the device 16 on an output 174 and a signal CLEAR_LS_FS_OC received from the fail-safe device 16 on a terminal 176.

There may, for example, be signals for protection from shortcircuit of the outputs LSx_FS towards the power supply. In the event of shortcircuit of the outputs towards the supply voltage VS, the low-side drivers have available a current limitation. In the case where the condition of limitation persists for longer than a certain time, the driver is automatically disabled (and the signal LS_FS_OC warns the main circuit of this situation) in order to prevent excessive dissipation of power from possibly damaging the circuit (thus it is possible to avoid implementation of a further thermal protection dedicated to the fail-safe circuit). When the main circuit is active, the driver can be re-enabled periodically (to resume functionality in the case where the shortcircuit is removed) by way of the signal CLEAR_FS_OC, which enables the driver to be switched on again.

Figure 5:
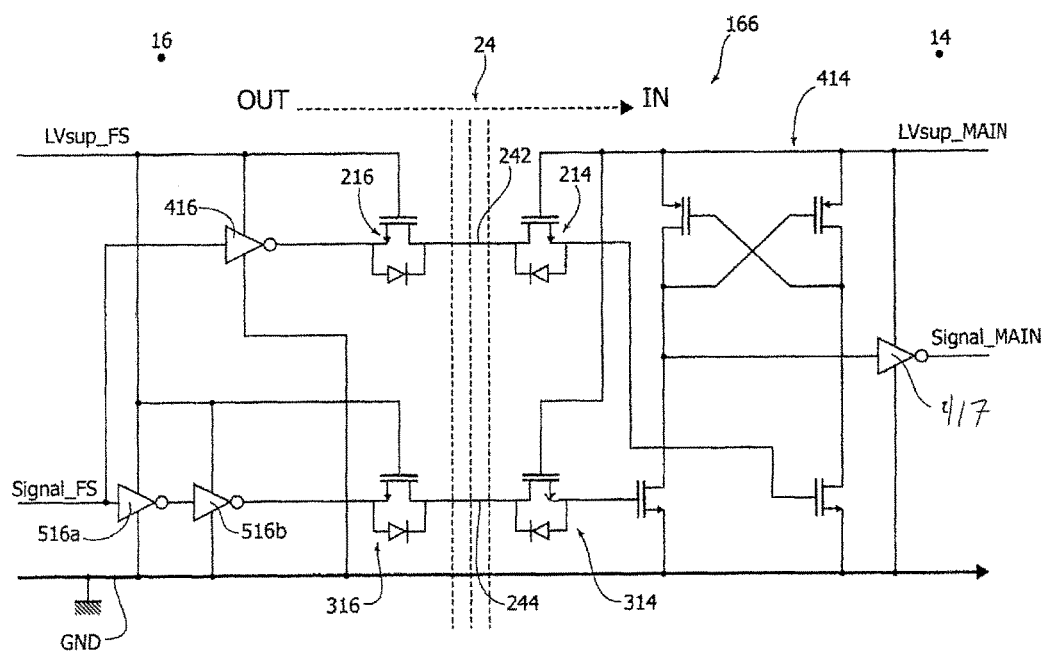
FIG. 5 is a circuit diagram of a protection network, according to the present disclosure.

In one or more embodiments, transmission of the signals between the main device 14 and the fail-safe device 16 can occur via a protection configuration 166, which may be obtained through the DTI 24 according to the features shown in FIG. 5. The above diagram represents, by way of example, the possible direction of transmission of the signals starting from the fail-safe device 16 (represented on the left in FIG. 5) towards the main device 14 (represented on the right in FIG. 5).

In addition to the presence of a ground line GND (it will on the other hand be recalled that the fail-safe device 16 may have available an autonomous connection of its own), FIG. 5 shows the presence of a power supply LVsup_FS of the fail-safe circuit 16. Even though it may nominally have the same value as the power supply LVsup_MAIN of the main circuit 14, the power supply LVsup_FS of the fail-safe circuit 16 may be generated by the block 160 in a way independent of the power supply LVsup_MAIN.

FIG. 5 exemplifies the possible transmission of a generic logic signal between the two circuits 14 and 16, for example, in the case of a digital signal (0 or else 1) transmitted by the fail-safe circuit 16 to the main circuit 14, with the possibility of adopting similar criteria for the transmission in the opposite direction, i.e. from the main circuit 14 to the fail-safe circuit 16.

In one or more embodiments, such a signal can assume a value corresponding, for example, to 0 V (logic 0) or LVsup_FS (logic 1). In this way, on the two lines 242 and 244 that traverse the DTI 24, represented with dashed lines, it is possible to transmit a signal (in direct form, SIGNAL) and its logic negated form (i.e., NOT-SIGNAL). It is possible, for example, for the signal transferred into the main circuit 14 to assume a voltage value of 0 V for the logic 0 and a value equal to LVsup_MAIN for the logic 1.

In one or more embodiments, there may be provided distinct lines (i.e. channels) for various signals (pairs Signal_FS, Signal_MAIN), with each line or channel that extends between two high-voltage devices, for example, MOSFETs 216 (fail-safe device 16) and 214 (main device 14), as well as 316 (fail-safe device 16) and 314 (main device 14). For instance, in the connection shown in FIG. 5, the signal LVsup_FS drives the gates of the MOSFETs 216 and 316, whereas in the homologous MOSFETs, i.e. in the MOSFETs 214 and 314, the gate is connected to the line on which the signal LVsup_MAIN is present, according to a substantially symmetrical arrangement.

The signal on the side of the fail-safe device 16 is instead sent, for example, via inverter stages 416 and 516a, 516b, respectively, to the sources of the MOSFET 216, on one side, and of the MOSFET 316, on the other side. The signals—output signals in this case—present on the sources of the MOSFETs 314 and 214 drive, via a level-shifter stage 414, an inverter 417, on which the signal signal_MAIN is present.

In one or more embodiments, as shown in FIG. 5, introduction of the high-voltage components 214, 216, 314 and 316 makes it possible to guarantee that, if on one of the sides of the DTI 24 (dashed lines) there occurs any failure, for which the voltage of the line that traverses the DTI 24 is shortcircuited at any voltage between 0 V and the maximum voltage envisaged by the technology, the circuit that is on the other side of the barrier is not damaged. It is possible, at the most, for proper transfer of the signal to be jeopardized, without, however, a generic "damage" on one side of the DTI 24 causing damage on the other side.

In one or more embodiments, the high-voltage elements 214, 216, 314, and 316 may, according to the technology, be of a high-voltage class with the inverters connected to the elements 216 and 316 that may be "weak" (at low current Iout), as well as the four MOSs (2 N-channel ones and 2 P-channel ones) designated by 414. The persons skilled in the art will appreciate that equivalent functions can be implemented by using different circuit solutions. In one or more embodiments, the fail-safe device 16 may be in a condition to operate altogether independently of the main device 14. This enables, for example, in one or more embodiments, assurance of transmission and reception of the signal (possibly encoded, for example, with Manchester encoding) that identifies onset of a condition such as to cause fail-safe triggering of the device.

Figure 6A:
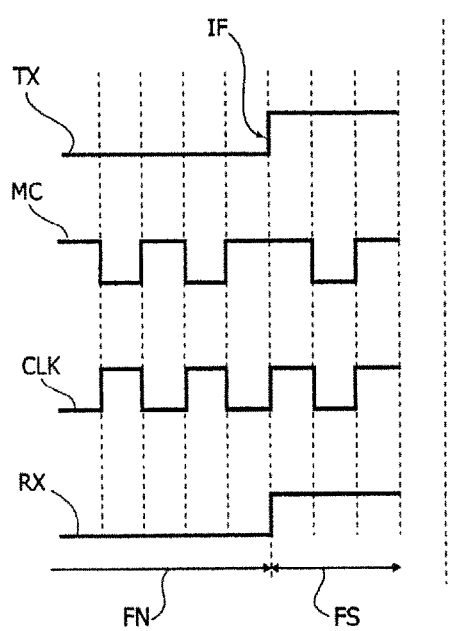
FIGS. 6a-6c illustrate various signals in the fail-safe device, according to the present disclosure.
Figure 6B:
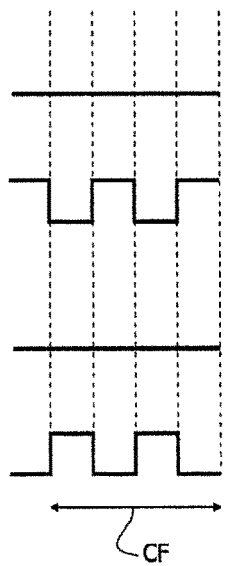
Figure 6C:
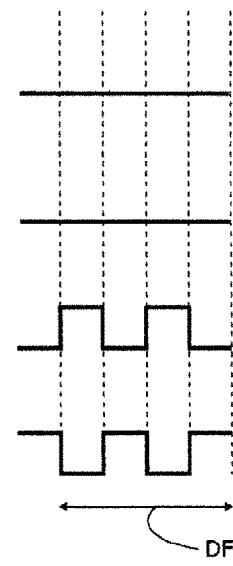

The diagrams of FIGS. 6a-6c exemplify possible modes of use of the aforesaid encoding in one or more embodiments. As indicated previously, in one or more embodiments, the encoder 144 and the decoder 172 may perform an action of Manchester encoding/decoding, in which each point is signalled by a transition. A Manchester encoding exemplifies a self-synchronizing encoding (such as not to require an external sync signal) such as to enable synchronization of a data flow in which each information bit is transmitted in a predefined time interval. As is known, a Manchester encoding can be viewed as a special case of a phase-shift-keying (PSK) encoding, where the datum to be transmitted controls the phase of a carrier square wave, which may be represented, in the case exemplified herein, by the clock signal CLK that drives the encoder 144 and, in conditions of normal operation, is received also by the decoder 172 through the input 165 of the fail-safe device 16.

FIG. 6a exemplifies the possible behaviour of the main circuit 14 (initially in conditions of absence of failure) upon occurrence, at the moment IF, of a fail-safe event detected in the main device 14 itself. The part at the center and on the left in FIGS. 6a-6c exemplify, instead, the behaviour in the case where failures occur, for example, at the clock level or at the data level.

The various charts of FIGS. 6a-6c represent in order, in timing diagrams that are assumed as referring to one and the same time scale: a transmitted signal TX (for example, coming from the logic gate 142) that may indicate onset of the fail-safe event at the moment IF; the corresponding encoded signal MC, for example, with Manchester encoding; the clock signal CLK received by the fail-safe device 16, from the decoder 172; and the signal RX as decoded by the decoder 172.

The representation of FIG. 6a exemplifies one or more embodiments in which at the moment IF the signal TX undergoes a transition—for example, from the low logic level to the high level logic—so as to function as "flag" indicating the fact that a fail-safe event has occurred in the main device 14. The representation of FIGS. 6a-6c refers to one or more embodiments in which it may—reasonably—be assumed that the signal TX is in any case a signal with slow evolution as compared to the frequency of the clock CLK used for encoding, for example, for Manchester encoding.

In the conditions shown in part FIG. 6a, the transition of the signal TX at the moment IF results in a corresponding transition of the received signal RX (the signal at the bottom in FIGS. 6a-6c), which also undergoes a transition indicating passage from a normal operating condition FN to a fail-safe operating condition FS.

The parts at the center and on the right in FIGS. 6a-6c designate that in one or more embodiments, the fail-safe device 16 is able to identify (implementing the required specific measures, for example, switching-off of the switches SW1, SW2) even conditions where the signal TX does not carry any flag identifying fail-safe events. Whereas (for example, owing to an interruption of the corresponding connections between the main device 14 and the fail-safe device 16) the encoded signal MC and/or the clock signal CLK fail/fails to be present, for example, in conditions where the respective signals are stuck.

As represented in FIG. 6b, in the case where the clock signal CLK fails to be present or else in FIG. 6c in the case where the encoded signal MC fails to be present, the signal RX at output from the receiver 172 may simply be a square-wave signal with a plot (and hence a frequency) similar to that of the clock signal CLK. In this way, the receiver (e.g., in block 168) can identify a condition of clock failure (CF) or else a condition of data failure (DF).

In one or more embodiments, the fail-safe device 16 may have available an autonomous clock 162 of its own that is in a condition to replace the clock CLK in the case where the latter is no longer received on the input 165 starting from the main device 14. In one or more embodiments, as exemplified herein, the fail-safe device 16 is able to operate independently of the main device 14, with the result that in the presence of failures of the device or of the system as a whole it is possible to prevent any malfunctioning or provide fail-safe interventions.

In one or more embodiments, the fail-safe device 16 may draw the supply voltage VS (battery) thanks to the connectivity (connection pins/pads, electrically conductive metal lines) present in the main device 14, with the possibility of using its own voltage regulator (block 160 in FIG. 2). In this way, blocks like the blocks 170a and 170b, which are able to perform the fail-safe function LS1_FS and LS2_FS, may be provided with a self-biasing of the type exemplified in FIG. 4.

In the event of a possible cut of the supply voltage of the fail-safe device 16 (e.g. on account of an interruption of the connection of the supply line VS or simply because the fail-safe device 16 is disabled), the corresponding driving units can draw the power supply from the output pin itself by activating the corresponding low-side driving device. In one or more embodiments, with the above approach, it is possible for the output network to be pulled down to a voltage lower than 2 V, namely, a voltage lower than the lowest threshold voltage of the external MOSFETs. In this way, it is possible to disable the fail-safe device 16 in stand-by modes, when it is desired to reduce current absorption as much as possible, for example, because in the stand-by modes one or more driven devices (for example, a window-regulator) are not activated.

One or more embodiments may envision measures for rendering the ground connection for the fail-safe circuit 16 particularly reliable. In one or more embodiments, it is consequently possible to envisage a redundant scheme with a first ground connection provided by the pins, the exposed pads, the connections, and the lines coming under the main device 14 with, in parallel, a ground connection provided inside the fail-safe device 16, for example, via substrate connections that surround the fail-safe device 16 as a whole.

In one or more embodiments, a reliable connection with low ohmic value may be rendered possible by resorting to the DTI structure exemplified with reference to FIG. 3 on a heavily doped substrate. One or more embodiments may consequently envision the co-existence and co-operation of one or more of the following characteristics: substrate connection via, for example, the DTI approach, such as to make available a propagation path with low ohmic value and a capacity to withstand high currents towards ground (via the exposed pad of the package) for the fail-safe driving units (170a, 170b in the diagram of FIG. 2) even in the case where the ground connectivity of the main device 14 is missing; supply-voltage connection VS shared with the main device 14, with provision of the self-bias function of the output driving stages (as exemplified in FIG. 4); protection of the connections between the devices 14 and 16 as exemplified in FIG. 5; possible location of the fail-safe device 16 in a corner position with respect to the main device 14 (FIG. 1); and possible recourse to the transmission of encoded signals (for example, with Manchester encoding).

Added to the above is the possibility of providing a sturdy and reliable device (possibly integrated in a single chip) for applications that are critical in terms of safety, for example, in the vehicle sector, for instance, in relation to actuator functions, such as the door-zone and power-management functions. Of course, without prejudice to the basic principles, the underlying details of construction and the embodiments may vary, even significantly, with respect to what has been described herein purely by way of non-limiting example, without thereby departing from the sphere of protection. The above field of protection is defined by the annexed claims.

That which is claimed is:

1. A fail-safe device to be coupled to a monitored device for actuating a switch responsive to a failure of the monitored device, the fail-safe device comprising:
   a fail-safe circuit; and
   an isolation trench located between the fail-safe circuit and the monitored device, wherein the fail-safe circuit comprises:
   an internal power supply connection,
   an internal reference voltage connection,
   a self-biased drive block configured to drive the switch, and
   a receiver configured to receive a plurality of encoded failure signals from the monitored device, each received encoded failure signal indicative of a different failure mode, wherein the receiver includes a decoder configured to decode each received encoded failure signal.

2. The fail-safe device of claim 1, wherein the isolation trench comprises a deep trench isolation configured to provide redundancy for the internal reference voltage connection.

3. The fail-safe device of claim 1, wherein the decoder comprises a frequency-shift keying (FSK) decoder.

4. The fail-safe device of claim 1, wherein the decoder comprises a Manchester decoder configured to decode Manchester encoded failure signals.

5. The fail-safe device of claim 1, wherein the decoder is configured to distinguish slowly varying signals conveying fail-safe state flagging information for the monitored device from encoded signals encoded with an encoding clock frequency, and wherein a received signal at the encoding clock frequency is indicative of a failure of a clock signal and/or a failure of data signals from the monitored device.

6. The fail-safe device of claim 1, wherein the switch is actuated by switching off the switch.

7. An electronic device comprising:
   a monitored device;
   a switch;
   a fail-safe device comprising
      a first transistor having a control terminal coupled to a first supply terminal,
      a second transistor having a control terminal coupled to the first supply terminal
      a third transistor having a control terminal coupled to a second supply terminal,
      a fourth transistor having a control terminal coupled to the second supply terminal,
      a fail-safe circuit, and
      an isolation trench located between the fail-safe circuit and the monitored device, the fail-safe circuit comprising an internal power supply connection,
an internal reference voltage connection,
a self-biased drive block configured to drive the switch, and
a receiver configured to receive failure signals from the monitored device; and
a first and second electrical connections coupling the fail-safe device with the monitored device via the first, second, third and fourth transistors, wherein the first transistor is coupled to the third transistor with the first electrical connection that passes through the isolation trench, and the second transistor is coupled to the fourth transistor with the second electrical connection that passes through the isolation trench, and wherein the first electrical connection is configured to carry a first signal flowing through the first and third transistors and the second electrical connection is configured to carry a negated first signal flowing through the second and fourth transistors so that a failure voltage applied to one of the monitored and fail-safe devices is prevented from propagating to the other of the monitored and fail-safe devices.

8. The electronic device of claim 7, wherein the isolation trench comprises a deep trench isolation (DTI) ring.

9. The electronic device of claim 7, wherein the isolation trench comprises a depth of about 25 um and a width of about 2.4 um.

10. The electronic device of claim 7, wherein the monitored device and the fail-safe device are integrated on a single chip.

11. The electronic device of claim 7, wherein the switch controls functions on board a vehicle.

12. A vehicle comprising:
an operating member controlled by a switch; and
an electronic device configured to actuate the switch responsive to a failure, the electronic device comprising
a monitored device,
a fail-safe device comprising a fail-safe circuit having a self-biased block configured to drive the switch,
an isolation trench
a receiver configured to receive a plurality of failure signals from the monitored device, and
an electrical connection coupling the fail-safe device with the monitored device, the electrical connection passing through the isolation trench, the electrical connection comprising distinct signal and negated signal lines so that a failure voltage applied to one of the monitored and fail-safe devices is prevented from propagating to the other of the monitored and fail-safe devices, wherein the plurality of failure signals comprises a plurality of encoded failure signals, wherein the receiver includes a decoder configured to decode each received encoded failure signal, and wherein each received encoded failure signal indicative of a different failure mode.

13. The vehicle of claim 12, wherein the decoder comprises a frequency-shift keying (FSK) decoder.

14. The vehicle of claim 12, wherein the isolation trench configured to isolate the fail-safe circuit from the monitored device, and wherein the fail-safe circuit comprises an internal power supply connection, and an internal reference voltage connection.

15. The vehicle of claim 12, wherein the isolation trench comprises a filling having an oxide-based material.

16. The vehicle of claim 14, wherein the isolation trench comprises a deep trench isolation configured to provide redundancy for the internal reference voltage connection.

17. The vehicle of claim 12, wherein plurality of failure signals comprises a watchdog failure signal, an under-voltage failure signal, or a thermal-shutdown failure signal.

18. The vehicle of claim 12, wherein the operating member comprises a motorized window having a window-regulator.

19. A method of making a fail-safe device to be coupled to a monitored device for actuating at least one switch responsive to a failure of the monitored device, the method comprising:
providing a fail-safe circuit; and
forming an isolation trench to isolate the fail-safe circuit from the monitored device, the fail-safe circuit comprising an internal power supply connection, an internal reference voltage connection, at least one self-biased drive block configured to drive the at least one switch, and a receiver configured to receive a plurality of failure signals from the monitored device, wherein the plurality of failure signals comprises a plurality of encoded failure signals, wherein the receiver includes a decoder configured to decode each received encoded failure signal, each received encoded failure signal indicative of a different failure mode.

20. The method of claim 19, wherein the isolation trench comprises a deep trench isolation configured to provide redundancy for the internal reference voltage connection.

21. The method of claim 19, wherein the decoder comprises a frequency-shift keying (FSK) decoder.

22. A device comprising:
a semiconductor substrate;
a first circuit disposed over the semiconductor substrate;
a second circuit disposed over the semiconductor substrate; and
a protection element located between the first circuit and the second circuit, wherein
the first circuit comprises
a first transistor having a control terminal coupled to a first supply terminal, and
a second transistor having a control terminal coupled to the first supply terminal,
the second circuit comprises
a third transistor having a control terminal coupled to a second supply terminal,
a fourth transistor having a control terminal coupled to the second supply terminal, and
the protection element comprises
an isolation trench disposed in the semiconductor substrate,
a first electrical connection coupled between the first transistor and the third transistor while passing through the isolation trench, and
a second electrical connection coupled between the second transistor and the fourth transistor while passing through the isolation trench.

* * * * *